United States Patent
Bayerer et al.

(10) Patent No.: US 8,198,721 B2
(45) Date of Patent: Jun. 12, 2012

(54) SEMICONDUCTOR MODULE

(75) Inventors: Reinhold Bayerer, Warstein (DE); Thomas Licht, Warstein (DE); Dirk Siepe, Dortmund (DE)

(73) Assignee: Infineon Technologies AG, Neubiberg (DE)

( * ) Notice: Subject to any disclaimer, the term of this patent is extended or adjusted under 35 U.S.C. 154(b) by 97 days.

(21) Appl. No.: 11/487,005

(22) Filed: Jul. 14, 2006

(65) Prior Publication Data

US 2007/0013046 A1    Jan. 18, 2007

(30) Foreign Application Priority Data

Jul. 18, 2005   (DE) .......................... 10 2005 033 469

(51) Int. Cl.
*H01L 23/48* (2006.01)

(52) U.S. Cl. ................. 257/690; 257/784; 257/E23.079

(58) Field of Classification Search .................. 257/690, 257/784, E23.079
See application file for complete search history.

(56) References Cited

U.S. PATENT DOCUMENTS

| | | | |
|---|---|---|---|
| 5,446,625 A * | 8/1995 | Urbish et al. ................. | 361/761 |
| 6,002,169 A * | 12/1999 | Chia et al. ..................... | 257/697 |
| 7,382,005 B2 * | 6/2008 | Lin et al. ....................... | 257/288 |
| 2003/0052420 A1 * | 3/2003 | Suzuki et al. .................. | 257/787 |
| 2003/0112605 A1 | 6/2003 | Hable | |
| 2004/0155356 A1 | 8/2004 | Furukuwa | |
| 2004/0164414 A1 * | 8/2004 | Venkateswaran ............. | 257/738 |
| 2004/0217470 A1 * | 11/2004 | Takano .......................... | 257/734 |
| 2005/0045369 A1 * | 3/2005 | Ishimaru et al. .............. | 174/250 |
| 2005/0067636 A1 * | 3/2005 | Amoh et al. ................... | 257/232 |
| 2005/0245050 A1 * | 11/2005 | Tsao et al. ..................... | 438/460 |

FOREIGN PATENT DOCUMENTS

| | | |
|---|---|---|
| DE | 4444388 A1 | 5/1996 |
| DE | 10102359 A1 | 8/2002 |
| DE | 69912565 T2 | 9/2004 |
| JP | 02094452 A | 4/1990 |
| JP | 10041298 | 2/1998 |
| WO | WO00/59029 | 10/2000 |

* cited by examiner

*Primary Examiner* — Cuong Q Nguyen
*Assistant Examiner* — Tran Tran
(74) *Attorney, Agent, or Firm* — Dicke, Billig & Czaja, PLLC

(57) ABSTRACT

A semiconductor substrate and a method for producing it is disclosed. In one embodiment, a contact region and a corresponding contact material of the semiconductor substrate are formed, in regions or completely, with a protection against oxidation.

15 Claims, 9 Drawing Sheets

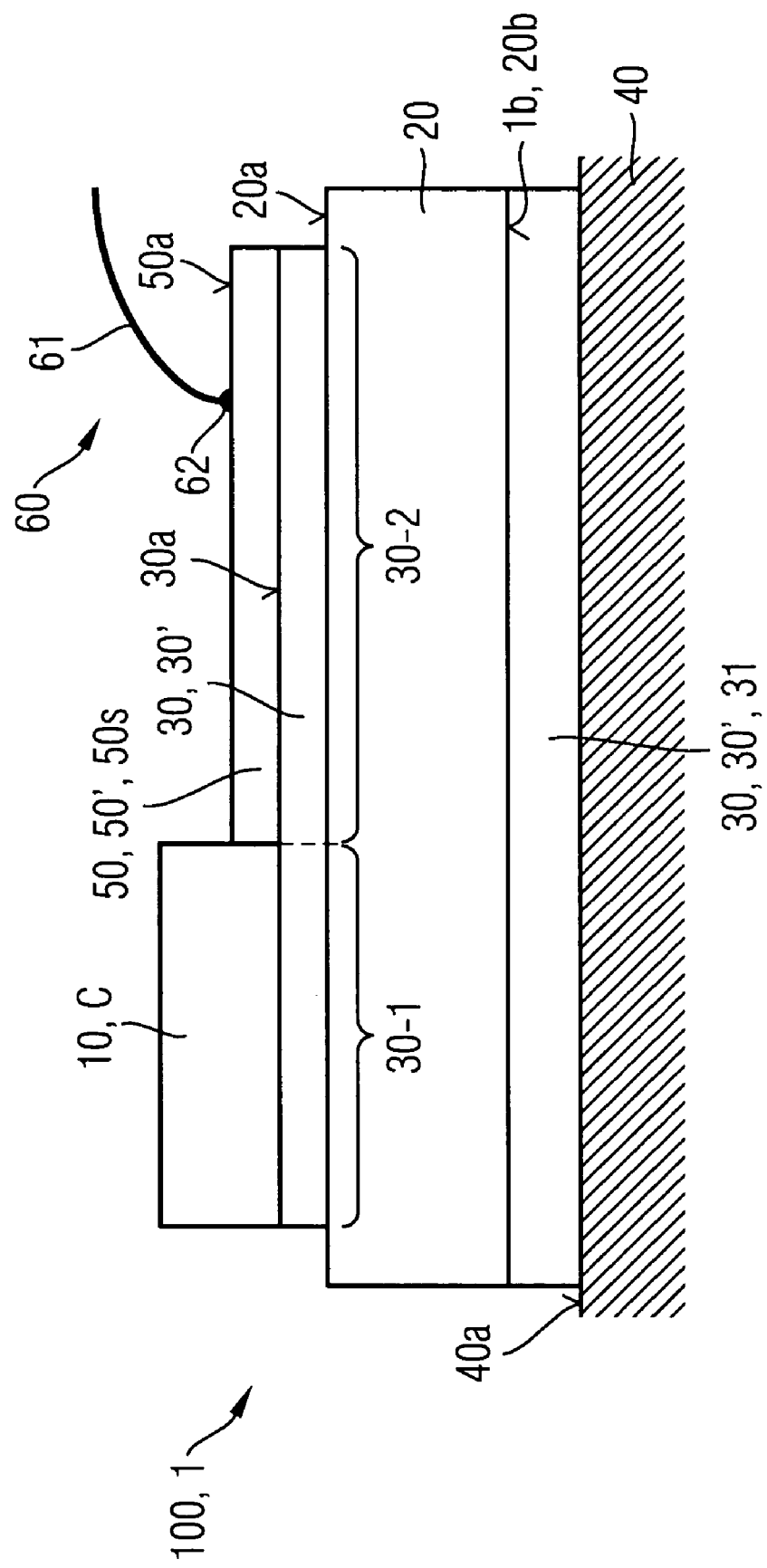

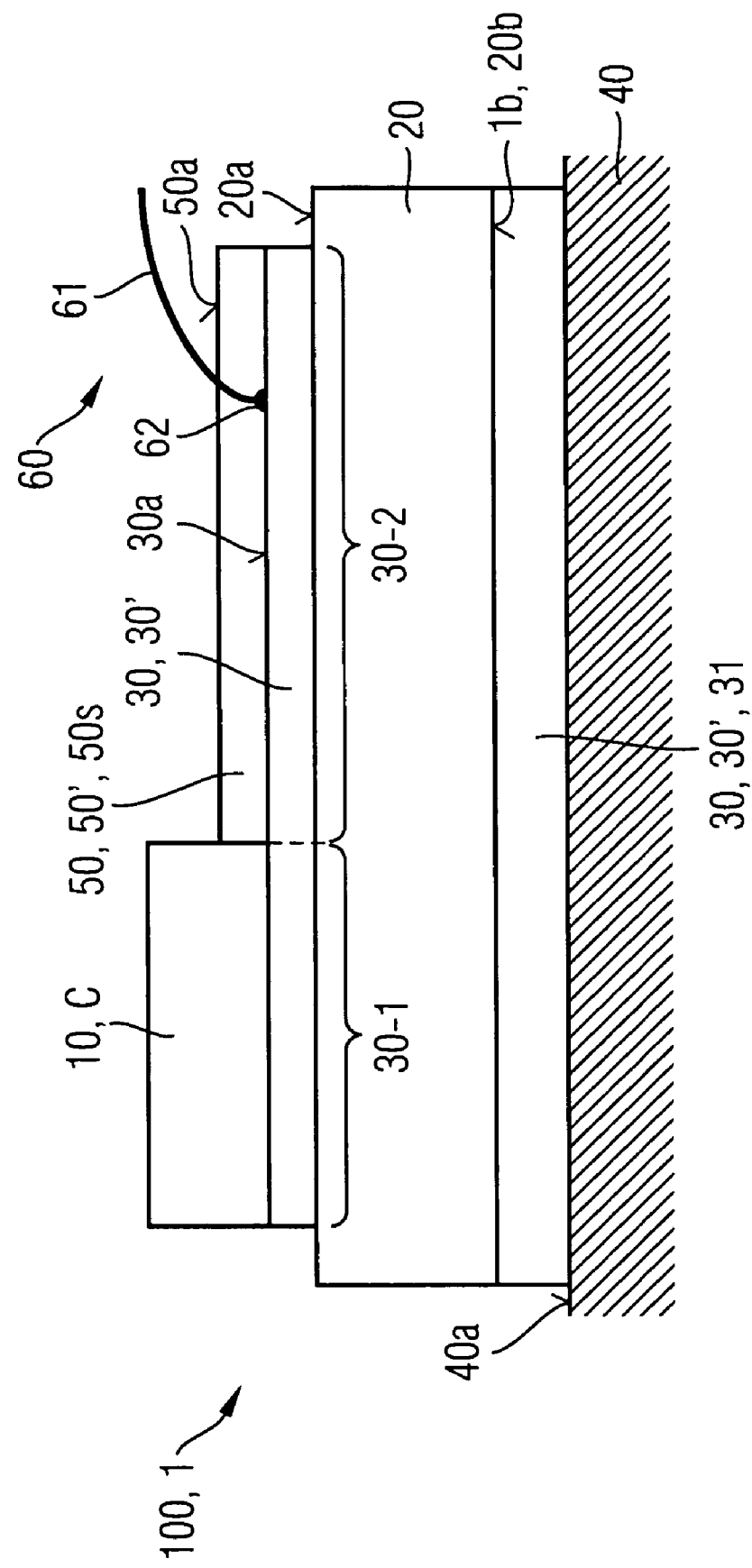

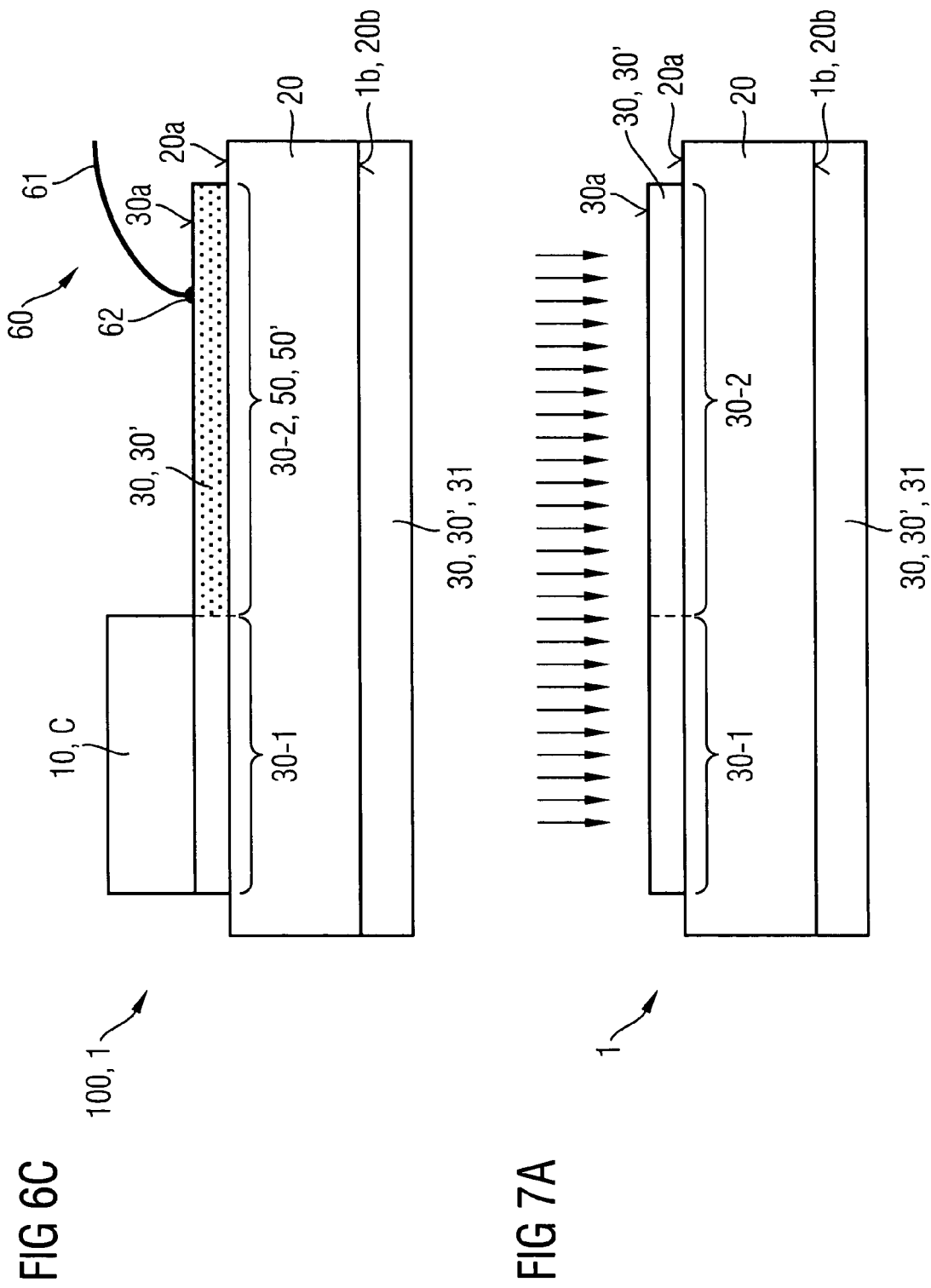

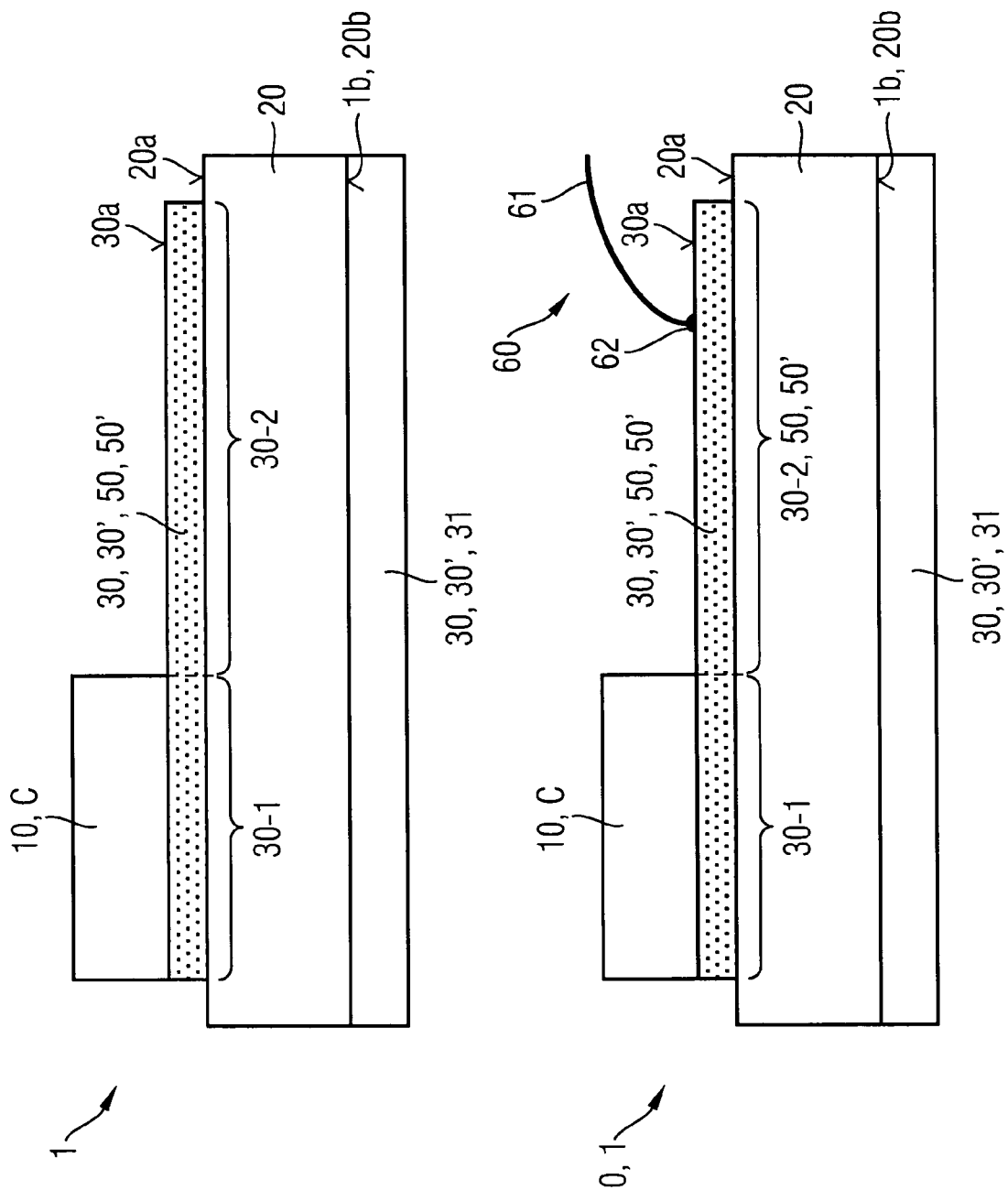

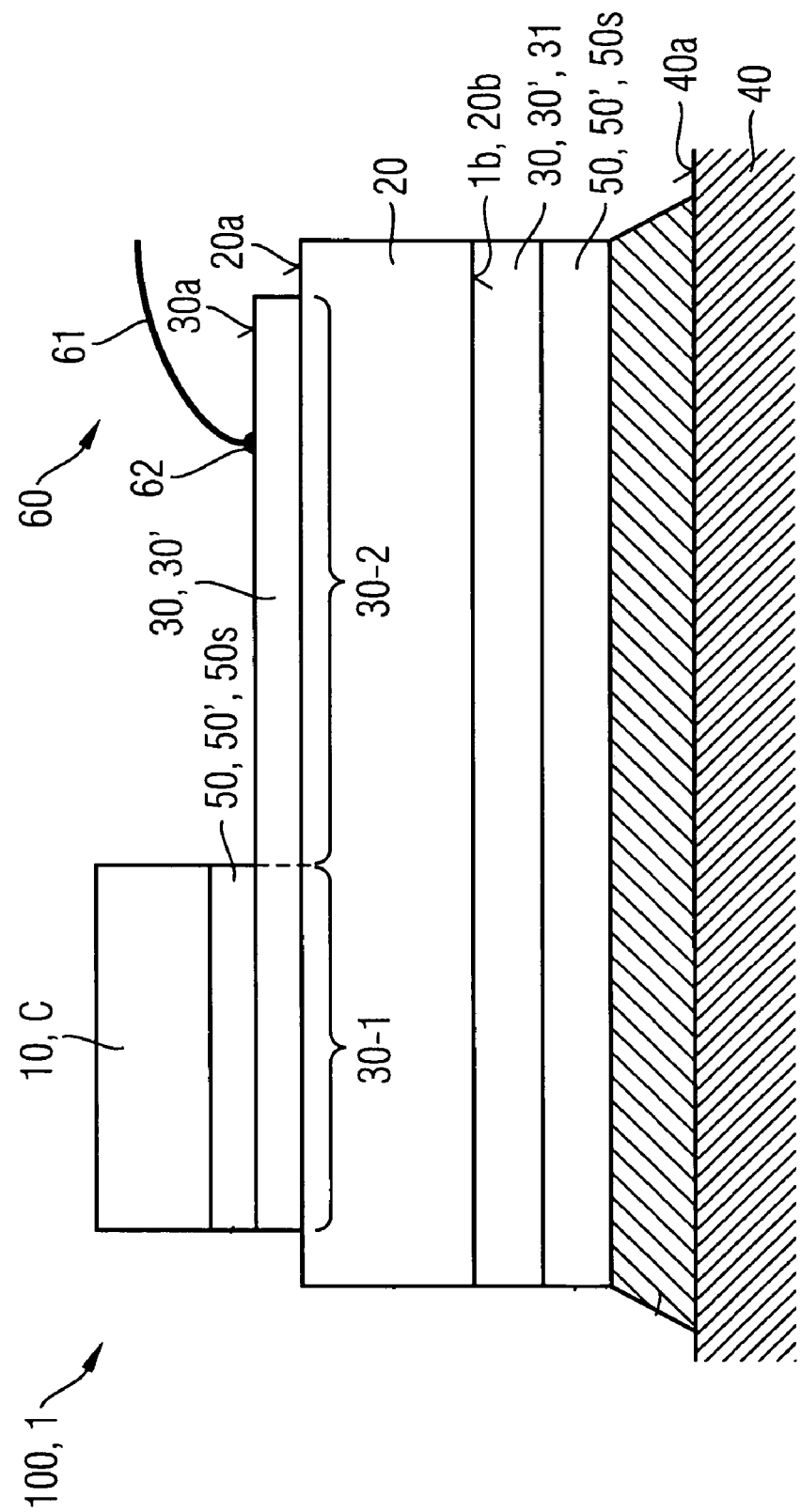

SEMICONDUCTOR MODULE

CROSS-REFERENCE TO RELATED APPLICATIONS

This Utility Patent Application claims priority to German Patent Application No. DE 10 2005 033 469.5 filed on Jul. 18, 2005, which is incorporated herein by reference.

BACKGROUND

The invention relates to a semiconductor substrate, a method for producing it and a method for producing a circuit module. The invention relates, in particular, to improvements in the bondability of power semiconductor substrates after processes.

In the further development of modern power semiconductor electronics, great importance is attached not only to possible miniaturization and improvement of functional reliability but also to simplifications in the area of the production methods, and the intention is for possible simplifications not to be obstructed by losses of quality.

In known production methods, semiconductor modules with semiconductor substrates on carriers have hitherto been produced by the finished semiconductor substrates being fitted on the surface of the carrier to be provided in each case and then being contact-connected externally. Between the actual production of the semiconductor substrate and the fitting and contact-connection by means of contact regions provided at the semiconductor substrate, that is to say between the actual production and corresponding placement methods in the formation of the modules, there may be considerable time intervals that have to be bridged by a corresponding storage process and/or transport for the semiconductor substrates once they have been produced.

It is now known that uncovered surfaces of the contact regions provided at semiconductor substrates are contaminated or exposed to a chemical conversion process, e.g., via oxidative attacks via the atmospheric oxygen provided in the atmosphere.

In known production and mounting methods, therefore, a protective gas atmosphere is provided, either during storage and/or during mounting or contact-connection itself. Forming and ensuring a corresponding protective gas atmosphere over a relatively long period of time means an additional outlay in terms of technical apparatus and also financially.

For these and other reasons, there is a need for the present invention.

SUMMARY

The present invention provides a semiconductor substrate and a method for producing it. In one embodiment, a contact region and a corresponding contact material of the semiconductor substrate are formed, in regions or completely, with a protection against oxidation.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 3 and 4 illustrate schematic and sectional side views of applications of the semiconductor substrate according to the invention from FIG. 2.

FIGS. 6A-6C illustrate schematic and sectional side views illustrating different intermediate stages of a method according to the invention for producing another embodiment of the semiconductor substrate according to the invention.

FIGS. 7A-7C illustrate schematic and sectional side views illustrating different intermediate stages of a method according to the invention for producing another embodiment of the semiconductor substrate according to the invention.

FIG. 8 illustrates a schematic and sectional side view illustrating a further embodiment of the semiconductor substrate according to the invention.

DETAILED DESCRIPTION

Figure 1:
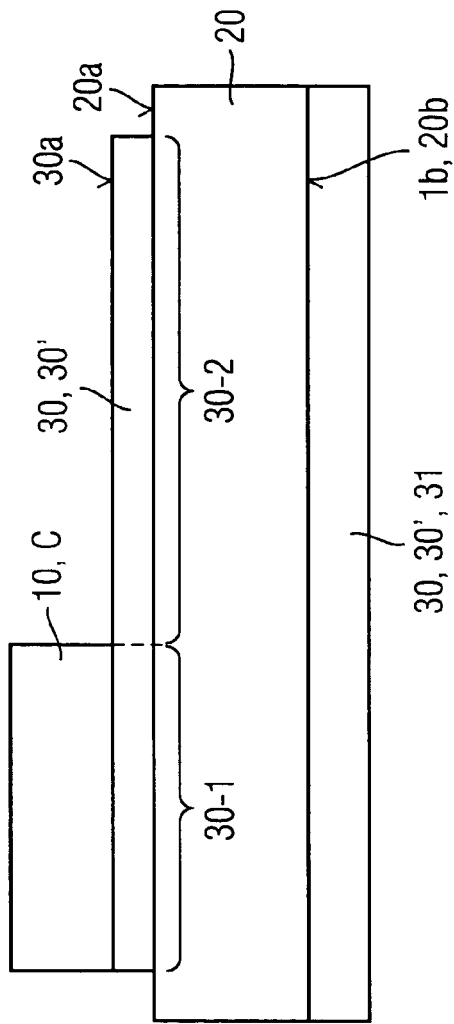
FIG. 1 illustrates a sectional and schematic side view of a precursor of a first embodiment of the semiconductor substrate according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Therefore, the invention provides a semiconductor substrate and a method for producing it and a method for producing circuit modules in the case of which high-quality contact regions and corresponding contacts can be realized and ensured in a particularly simple yet reliable manner.

In the case of a semiconductor substrate, the object on which the invention is based is achieved according to the invention by means of the features of independent patent claim 1. The dependent subclaims respectively relate to embodiments of the invention.

In one embodiment of the invention, contact regions that are formed or to be formed at a semiconductor substrate are made resistive and durable, in particular with respect to oxidative processes on account of the oxygen present in the atmosphere.

Accordingly, the invention provides a semiconductor substrate, in which a carrier substrate with a top side and with an underside, at least one semiconductor circuit arrangement on the top side and/or on the underside of the carrier substrate and at least one contact region for later external and/or internal contact-connection of the semiconductor substrate made from or with a contact material with a surface region on the top side and/or on the underside of the carrier substrate are formed, and in which the contact region and/or the contact material are/is formed, in regions or completely, with a protection against oxidation.

In accordance with one embodiment of the semiconductor substrate according to the invention, it is provided that the protection is formed as a topmost material region or as a protective layer of the contact region or on the contact region and the surface of the contact region.

In accordance with another embodiment of the semiconductor substrate according to the invention, it is provided that the protection is formed in multilayer fashion.

In a further embodiment of the semiconductor substrate according to the invention, it is provided that the protection is formed as an admixture or as one or more material constituents of the contact region and of the contact material.

In accordance with another embodiment of the semiconductor substrate according to the invention, it is conceivably provided that the protection is formed with or from a conformal and/or coplanar layer.

In accordance with one embodiment of the semiconductor substrate according to the invention, it is provided that the protection is formed with or from a monomolecular layer.

In one embodiment of the semiconductor substrate according to the invention, it is provided that the protection is formed with or from a material or an arbitrary combination of materials from the group formed by electrically insulating materials, electrically conducting materials, organic materials, benzimidazoles, inorganic materials, metallic materials, metals, Ti, TiW, TiV, Cr, Al, Au, Ag, Pd, Ni, V, Pt, alloys thereof and oxides thereof.

In accordance with another embodiment of the semiconductor substrate according to the invention, it is provided that the protection is provided as a chemically selective structure applied by vapor deposition, applied by sputtering, formed by means of dip wetting, by means of spraying and/or by means of printing.

In another embodiment of the semiconductor substrate according to the invention, the semiconductor substrate is formed as a DCB substrate, as a DAB substrate and/or as an AMB substrate.

Furthermore, in another embodiment of the semiconductor substrate according to the invention, it is conceivable that the semiconductor circuit arrangement is formed on a first part of a contact region and thus indirectly on the top side and/or on the underside of the carrier substrate, and that only a second part of the contact region that is not covered by the semiconductor circuit arrangement is formed with the protection or a part of the protection.

A further embodiment of the present invention also provides a method for producing a semiconductor substrate, in which a carrier substrate with a top side and with an underside, at least one semiconductor circuit arrangement on the top side and/or on the underside of the carrier substrate and at least one contact region for later external and/or internal contact-connection of the semiconductor substrate made from or with a contact material with a surface region on the top side and/or or the underside of the carrier substrate are formed, and in which the contact region and/or the contact material are/is formed, in regions or completely, with a protection against oxidation.

In accordance with one embodiment of the method according to the invention for producing a semiconductor substrate according to the invention, it is provided that the protection is formed as a topmost material region or as a protective layer of the contact region or on the contact region and the surface of the contact region.

In accordance with another embodiment of the method according to the invention for producing a semiconductor substrate according to the invention, it is provided that the protection is formed in multilayer fashion.

In a further embodiment of the method according to the invention for producing a semiconductor substrate according to the invention, it is provided that the protection is formed as an admixture or as one or more material constituents of the contact region and of the contact material.

In accordance with another embodiment of the method according to the invention for producing a semiconductor substrate according to the invention, it is conceivably provided that the protection is formed with or from a conformal and/or coplanar layer.

In accordance with one embodiment of the method according to the invention for producing a semiconductor substrate according to the invention, it is alternatively or additionally provided that the protection is formed with or from a monomolecular layer.

In one embodiment of the method according to the invention for producing a semiconductor substrate according to the invention, it is alternatively or additionally provided that the protection is formed with or from a material or an arbitrary combination of materials from the group formed by electrically insulating materials, electrically conducting materials, organic materials, benzimidazoles, inorganic materials, metallic materials, metals, Ti, TiW, TiV, Cr, Al, Au, Ag, Pd, Ni, V, Pt, alloys thereof and oxides thereof.

In accordance with another embodiment of the method according to the invention for producing a semiconductor substrate according to the invention, it is provided that the protection is provided as a chemically selective structure applied by vapor deposition, applied by sputtering, formed by means of dip wetting, by means of spraying and/or by means of printing.

In another embodiment of the method according to the invention for producing a semiconductor substrate according to the invention, the semiconductor substrate is formed as a DCB substrate, as a DAB substrate and/or as an AMB substrate.

Furthermore, in another embodiment of the method according to the invention for producing a semiconductor substrate according to the invention, the semiconductor circuit arrangement is formed on a first part of a contact region and thus indirectly on the top side and/or on the underside of the carrier substrate, and that only a second part of the contact region that is not covered by the semiconductor circuit arrangement is formed with the protection or a part of the protection.

A further embodiment of the present invention also provides a method for producing a circuit module, having the process of: providing at least one semiconductor substrate according to the invention with a semiconductor circuit on a carrier substrate with an underside; providing at least one carrier with a top side or surface; fitting and fixing the semiconductor substrate with the underside of the substrate or the semiconductor substrate on the top side or surface of the carrier; and electrically contact-connecting the semiconductor substrate by forming an electrical contact to the contact region, in which, given the presence of an electrically insulating layer as protection of the contact region or a part thereof, prior to the process of electrical contact-connection, the electrically insulating protective layer of the protection is firstly removed completely or partly from the contact region or the part of the contact region and then contact-connection is effected onto the free surface of the contact region during the process of electrical contact-connection, or in which, given the presence of an electrically insulating layer as protection of the contact region or a part thereof, contact-connection is effected through the protective layer of the protection toward the contact region during the process of electrical contact-connection, or in which, given the presence of an electrically conducting protective layer as protection of the contact region or a part thereof, contact-connection is effected onto the protective layer of the protection during the process of electrical contact-connection.

These and further embodiments of the present invention are explained further using different words on the basis of the observations below:

circuit modules and in particular power semiconductor modules are electronic modules which comprise circuits on insulating substrates. The circuits comprise both control electronics and power semiconductors. The power semiconductor circuits are generally constructed on so-called DCB or AMB substrates. These substrates comprise ceramics for insulation and on both sides thick Cu layers or Al (typically in the region of approximately 300 µm, that is to say e.g., minimally in the region of approximately 50 µm and maximally in the region of approximately 1 mm) which are connected to the ceramics by the DCB, DAB or AMB method (DCB: direct copper bonding, DAB direct aluminum bonding). The top side is patterned in the general case. The power semiconductor chips are also mounted thereon (soldering, low temperature methods, adhesive bonding, etc.). The substrates populated with power semiconductors are often produced in a dedicated soldering or other connection process, during which connections are also implemented from the chip top sides to the assigned substrate contact areas. These connections are generally effected by means of ultrasonic wire bonding. These substrates can already be tested electrically in this state. Consequently, it is possible to sort out defective substrates for modules with a plurality of substrates prior to assembly (by soldering, low temperature methods, adhesive bonding on the carrier) and the yield of the entire module rises. After assembly in modules, it is generally necessary to produce even further electrical connections between the substrates of a module. These are often likewise produced by means of wire bonds, soldering, laser welding or other welding methods. Substrates are stored for a time between the processes for producing the substrates including the electrical tests and assembly with connection in the module. They are in some instances also subjected to thermal processes or even sent to other production lines. The electrical test also proceeds at high temperature (70°-200° C.) and constitutes one of the thermal processes. In order to avoid oxidation of the free metal surfaces (Cu, Ni) of the substrates, storage is effected in an $N_2$ atmosphere. Hot processes are carried out under a protective gas ($N_2$, $H_2/N_2$ or the like). Transport is effected in vacuumtight containers. The provision of a protective gas atmosphere brings about a high outlay in terms of apparatus and produces costs through consumption of the gases. Vacuumtight containers for transport are very costly. These disadvantages are intended to be avoided by virtue of the substrates becoming resistant toward thermal processes, storage and transport in air. Resistance means that the connection processes in the module can be carried out with high quality and yield without reducing the quality.

Previous practice effected protection by storage, intermediate processes and transport under a protective gas or vacuum.

The substrates are intended to be pretreated correspondingly prior to being populated with chips such that the metal surfaces which are uncovered after the populating process and are required for later mounting and connection in the module remain sufficiently pure and exhibit a sufficiently low oxidation. As an alternative, the substrates are treated directly after or in the process for producing the substrates, in order to keep them "fresh".

One aspect of the invention thus consists in making substrates resistant to air atmosphere (oxidation) by pretreatment.

Exemplary Embodiments a. In the case of substrates having a bare Cu surface, the reaction of the copper surface with oxygen is prevented by a monolayer or a coplanar layer. This is between a few nanometers and approximately 2 µm thick and includes, by way of example, benzimidazoles (product based thereon e.g., the Entek Plus family from Enthone). This layer can remain on the surface for soldering connections, is penetrated during ultrasonic bonding and can also be applied selectively. These layers are distinguished, moreover, by the fact that they can be removed by means of solvents. The wetting capability of the copper surface is not altered. This layer is applied by customary coating methods for aqueous substances; emphasis shall be placed here on dip wetting, spraying methods or printing methods (stencil printing, pad printing, roller printing). As an alternative or else in a supplementary manner, a layer may be produced by means of a sol-gel method. This layer serves not only for oxidation protection but also for realizing good adhesion for subsequent layers or adhesive layers or the like.

b. In the case of nickel-plated surfaces, it is possible to use the same method as described under a.

c. Substrates having a Cu (DCB) or Ni surface are coated by sputtering or vapor deposition with a thin layer (2 nm, . . . , 100 nm) of Ti, TiW, TiV, V, Cr, Pt, alloys thereof or oxides thereof selectively where no chips are to be soldered on. The applied layers prevent oxidation of the surfaces and permit connections e.g., by ultrasound, laser welding or the like. Moreover, the layers constitute a soldering resist, so that solder required for soldering on the chips cannot flow out. The additional layers are applied selectively with the aid of stencils which cover at least the chip soldering areas.

d. The thin layers under c. are strengthened with particularly readily bondable (ultrasound) non-oxidizing surfaces e.g., Al (sputtering, vapor deposition)—100 nm, . . . , 20 µm—typically: 3 µm.

e. For the case where the rear sides of the substrates are intended to be mounted by adhesive bonding in the module and Cu or Ni surfaces are involved, the layers under c., or else additionally as under d. are also applied to the rear side. This enables better adhesion of the adhesives and a permanent adhesive strength, because the oxidation of the metal surface at the adhesive boundary layer is also permanently avoided thereby.

f. Substrates produced with Al as conductor tracks, prior to processing, on the areas to be soldered, are coated with Ti, . . . or Cr by sputtering or vapor deposition or reinforced with Ni in order to provide a solderable surface. The exposed Al surfaces do not oxidize further even in air, so that these finished substrates can later be adhesively bonded without additional outlay and/or can be connected by means of wire bonds using ultrasound.

g. Substrates with thick Al can be metalized not only with Ti, . . . , Cr and Ni, NiP, NiB but also with further layers on the soldering areas: e.g., Ag, Pd, Au.

h. As an alternative the additional layers may also be applied chemically selectively.

i. For substrates on which chips are mounted by low temperature methods (low temperature sintering methods with silver paste), in the case of substrates thickly coated with Al, the mounting areas are selectively silver-plated or gold-plated like f or g. The remaining regions retain their Al surfaces.

j. If the substrates are intended to be soldered on the rear side, Al substrates are nickel-plated and silver-plated or gold-plated on the rear side.

k. Substrates with thick Cu layers (DCB, AMB) are completely gold-plated or silver-plated on the top for connection by low temperature methods. If they are intended to be soldered or likewise connected by low temperature methods on the rear side, they are also silver-plated or gold-plated on the rear side. The underlying construction is effected as under c and g.

The substrates are either selectively coated or preserved after the production processes, thus enabling storage, transport and thermal processes before producing the connections in the module even in air atmosphere.

Structurally and/or functionally similar or comparable elements are designated by the same reference symbols below, without a detailed description being repeated whenever they occur.

FIG. 1 illustrates a schematic and sectional side view of a precursor of a semiconductor substrate 1' such as may also be taken as a basis for a production method according to the invention. The arrangement of the semiconductor substrate 1' from FIG. 1 may accordingly also be referred to as semiconductor substrate 1' from the prior art.

A ceramic substrate as carrier 20 forms the basis of the semiconductor substrate 1' from the prior art as a precursor of an embodiment of the production method according to the invention. However, any other insulator may be involved, too. The carrier 20 has a top side or surface 20*a* and also an underside 20*b*, which simultaneously also forms the underside 1*b* of the conventional semiconductor substrate 1'. A contact region 30 of a contact material 30' is formed on the top side 20*a* of the carrier 20, which contact region, for its part, likewise has a surface 30*a* or a top side 30*a* that is remote from the top side 20*a* of the carrier 20. A semiconductor circuit arrangement 20 in the form of a chip C is formed on the surface or top side 30*a* of the contact region 30. A first part 30-1 of the contact region 30 is covered by the chip C of the semiconductor circuit arrangement 10, while a second part 30-2 of the contact region 30 remains free with regard to its top side 30*a*. An optional rear side metalization 31 is also indicated, which is formed on the underside 20*b* of the carrier 20 and may serve for later contact-connection and thermal linking of the semiconductor substrate 1 according to the invention prior to joining together (soldering, low temperature methods, adhesive bonding) to form a semiconductor module 100.

Figure 2:
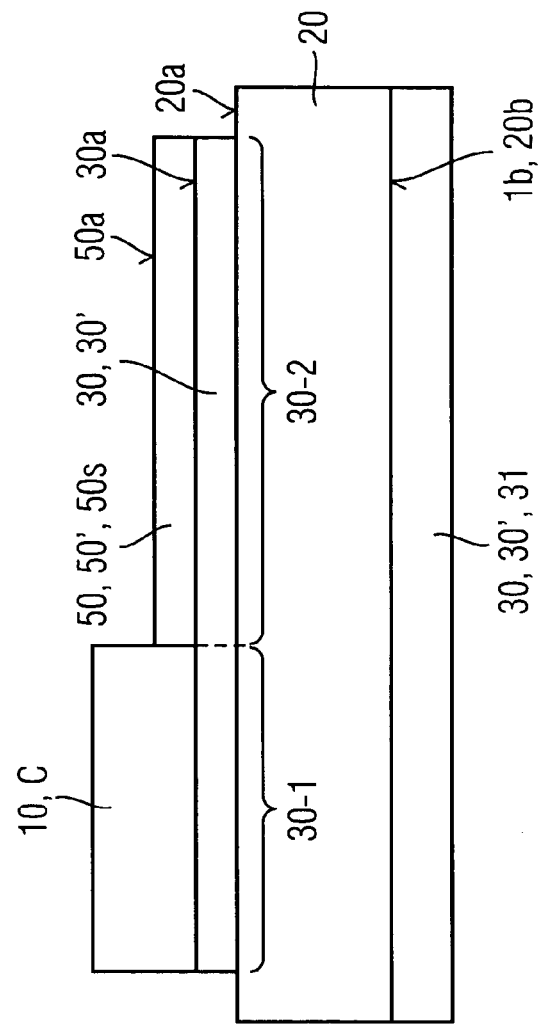
FIG. 2 illustrates a schematic and sectional side view of a first embodiment of the semiconductor substrate according to the invention.

The situation illustrated in FIG. 2, likewise in the form of a schematic and sectional side view, essentially reflects the conditions of the arrangement from FIG. 1. As seen overall, a first embodiment of the semiconductor substrate 1 according to the invention is illustrated there.

A contact region 30 on a contact material 30' with a top side 30*a* or surface 30*a* is provided on a carrier 20 with a top side 20*a* or surface 20*a* and an underside 20*b*, which also forms the underside 1*b* of the semiconductor substrate 1 according to the invention. A chip for a semiconductor circuit arrangement 10 is provided on the surface 30*a* of the contact region 30 in such a way that a first part 30-1 of the contact region 30 and thus a first part of the corresponding surface 30*a* is covered by the chip C, while a second part 30-2 of the contact region 30 and thus of the surface 30*a* remains free.

In the embodiment of FIG. 2, the region 30-2 of the contact region 30 that remains free is covered with a protection 50 or protective region 50 in the form of a protective layer 50*s* with a surface 50*a*, so that during storage or else during further processing steps, the protective layer 50*s* serves as a diffusion barrier for harmful atmospheric constituents to the contact region 30 and the corresponding contact material 30', with the result that impairment by a chemical conversion with the contact material 30' is avoided and, consequently, the semiconductor substrate 1 according to the invention is made resistant as seen overall.

FIG. 3 illustrates, in a schematic and sectional side view, the use of the arrangement of the semiconductor substrate 1 according to the invention as illustrated in FIG. 2 in a circuit module 100.

In this case, the arrangement illustrated in FIG. 2 for the semiconductor substrate 1 according to the invention, with the underside 20*b*, 1*b* and the corresponding rear side metalization 31, is fitted and fixed on the surface 40*a* of a carrier substrate 40.

The arrangement of the semiconductor substrate 1 according to the invention essentially corresponds to the arrangement illustrated in FIG. 2.

A contact region 30 on a contact material 30' with a top side 30*a* or surface 30*a* is provided on a carrier 20 with a top side 20*a* or surface 20*a* and an underside 20*b*, which also forms the underside 1*b* of the semiconductor substrate 1 according to the invention. A chip for a semiconductor circuit arrangement 10 is provided on the surface 30*a* of the contact region 30 in such a way that a first part 30-1 of the contact region 30 and thus a first part of the corresponding surface 30*a* is covered by the chip C, while a second part 30-2 of the contact region 30 and thus of the surface 30*a* remains free.

The second part 30-2 of the contact region 30 that remains free is in turn formed with a protective layer 50*s* as protection 50 on its surface 30*a* and the protective region 50 with the corresponding surface 50*a* is formed.

A contact 60 is provided here in the form of a bonding wire 61, the contact end 62 of which is fitted as contact-connection on the surface 50*a* of the protective layer 50*s* of the protective region 50. This presupposes that the material of the protective layer 50*s* of the protective region 50 is electrically conductive.

In the embodiment of FIG. 4, by contrast, the material of the protective layer 50*s* of the protective region 50 may also be formed in electrically insulating fashion since the contact location 62 of the bonding wire 61 serving as contact 60 in this case extends in a plated-through hole as far as the surface 30*a* of the contact region 30 and in particular the second part 30-2 thereof, in order to achieve an electrical contact-connection.

For the rest, the arrangement illustrated in FIG. 4 corresponds to the conditions from FIGS. 2 and 3.

A contact region 30 on a contact material 30' with a top side 30*a* or surface 30*a* is provided on a carrier 20 with a top side 20*a* or surface 20*a* and an underside 20*b*, which also forms the underside 1*b* of the semiconductor substrate 1 according to the invention. A chip for a semiconductor circuit arrangement 10 is provided on the surface 30*a* of the contact region 30 in such a way that a first part 30-1 of the contact region 30 and thus a first part of the corresponding surface 30*a* is covered by the chip C, while a second part 30-2 of the contact region 30 and thus of the surface 30*a* remains free.

The underside 20*b*, 1*b* of the substrate 20 or respectively of the semiconductor substrate 1 is again arranged with the underside metalization 31 in between on the surface 40*a* of a provided carrier substrate 40 of the circuit module 100 formed.

Figure 5A:
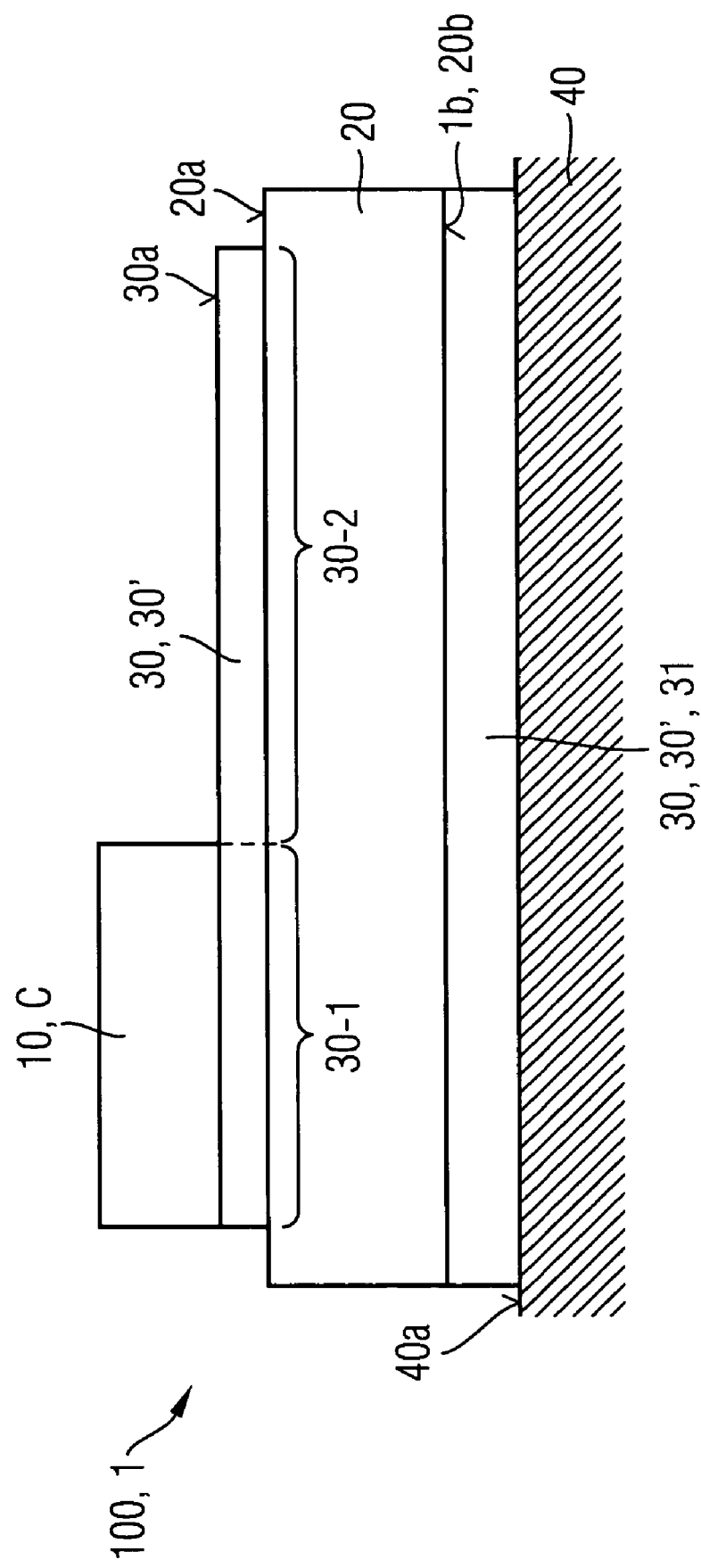
FIGS. 5A and 5B illustrate schematic and sectional side views of applications of the semiconductor substrate according to the invention from FIG. 2.
Figure 5B:
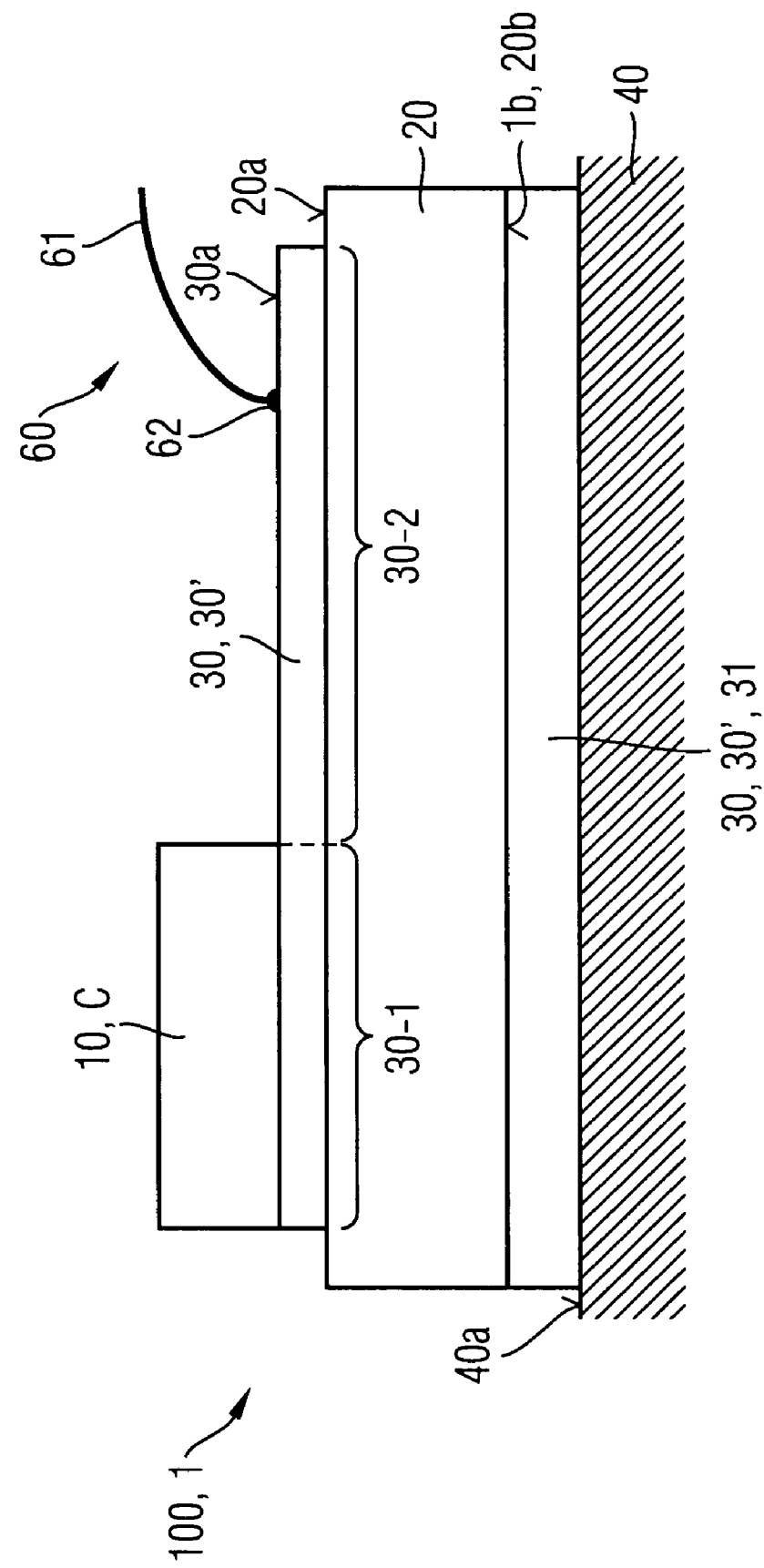

FIGS. 5A and 5B illustrate comparable arrangements in which, proceeding from an arrangement in accordance with FIG. 2 for a semiconductor substrate 1, the semiconductor substrate 1 is firstly arranged with the underside 20*b*, 1*b* and the rear side metalization 31 to be provided in between on the surface 40*a* of a carrier substrate 40 for a circuit module 100. In accordance with the illustration of FIG. 5A, the protective layer 50*s* of the protective region 50 is then removed from the second part 30-2 and the corresponding surface 30*a* of the contact region 30, this preferably being done shortly before the formation of a contact-connection. As a result of this operation, the surface 30*a* of the contact region 30 is then uncovered again in the region of the second part 30-2, so that, in transition to the situation illustrated in FIG. 5B, it is possible to effect a direct contact-connection of a contact 60 in the form of a bonding wire 61 with a contact end 62 directly on the surface 30*a* of the contact region 30.

Figure 6A:
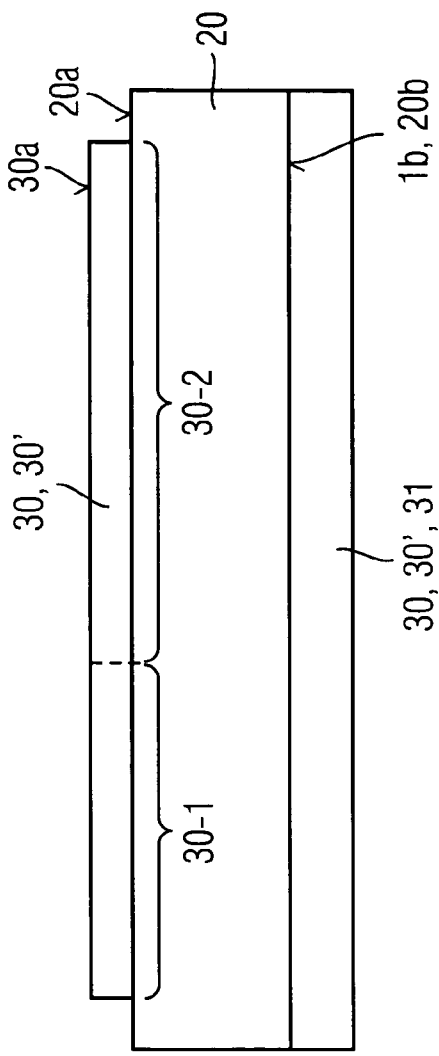
Figure 6B:
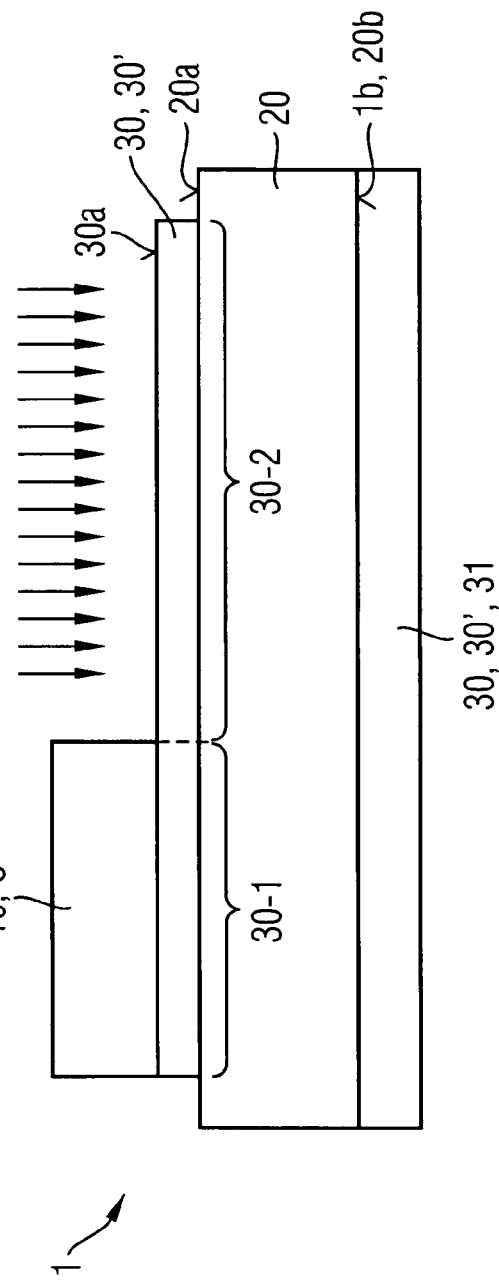

The sequence of FIGS. 6A to 6C illustrates the formation of another type of protection 50 in another embodiment of the semiconductor substrate 1 according to the invention.

FIG. 6A firstly illustrates the carrier 20 with its top side 20*a* and its underside 20*b*, the material 30' for the contact region 30 with a corresponding surface 30*a* being provided in large-area fashion on the top side 20*a*.

In transition to the intermediate state illustrated in FIG. 6B, the chip C for the semiconductor circuit arrangement 10 is then applied in the region of a first part 30-1 of the contact region 30 in such a way that a second part 30-2 of the contact region remains free.

In transition to the intermediate state illustrated in FIG. 6C, a type of doping is then introduced into the material 30' via the surface 30*a* of the second part 30-2 of the contact region 30 that remained free. The resistance to the atmospheric constituents, in particular to atmospheric oxygen, is achieved by means of this doping. This therefore gives rise to the advantageous protection 50 by a material combination of the original material 30' for the contact region in combination with the dopant that is to be correspondingly provided.

In the embodiments formed in accordance with the sequence of FIGS. 7A to 7C, rather than subsequent doping of a material 30' for the contact region 30 after it has been deposited, doping takes place through simultaneous deposition of the material 30' for the contact region 30 and of a corresponding dopant.

This means, in detail, that firstly, proceeding from the state of FIG. 7A, in which the substrate 20 with the surface 20*a* and the underside 20*b* is provided, in transition to the intermediate state illustrated in FIG. 7B, a substance mixture including the actual content material 30' and a dopant is simultaneously deposited as contact region 30. The material combination of the actual contact material 30' with the dopant already results in the resistance to the previously harmful atmospheric constituents.

The completion of the contact region 30 already protected in this way, namely protection 50 formed by inherent mixing and by material mixing, is then followed by the application of the chip C for the semiconductor circuit arrangement 10 in a first part 30-1 of the contact region 30, so that the second part 30-2 of the contact region 30 once again remains free for later contact-connection.

FIG. 8 illustrates another embodiment of the semiconductor substrate 1 according to the invention in connection with a circuit module 100.

A contact region 30 on a contact material 30' with a top side 30*a* or a surface 30*a*, to be precise in the form of an aluminum layer, is provided on a carrier 20 with a top side 20*a* or a surface 20*a* and an underside 20*b*, which also forms the underside 1*b* of the semiconductor substrate 1 according to the invention. A chip for a semiconductor circuit arrangement 10 is provided on the surface 30*a* of the contact region 30 in such a way that a first part 30-1 of the contact region 30 and thus a first part of the corresponding surface 30*a* is covered by the chip C, while a second part 30-2 of the contact region 30 and thus of the surface 30*a* remains free.

In the embodiment of FIG. 8, the covered region 30-1 of the contact region 30 is covered with a protection 50 or protective region 50 in the form of a protective layer 50*s* with a surface 50*a*, to be precise in the form of a solderable layer.

In the embodiment of the semiconductor substrate 1 according to the invention in accordance with FIG. 8, the rear side metalization 31 is also provided with a protection 50 in the form of a protective layer 50*s* made of a protective material 50'. This is adjoined by a connecting layer, e.g., in the form of a soldered joint, a layer produced by low temperature methods, or in the form of an adhesive bond, by means of which this embodiment of the semiconductor substrate according to the invention is fitted and fixed on the top side 40*a* of the carrier.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module, comprising:
   a ceramic carrier substrate with a contact region made of a material formed on a top side of the ceramic carrier substrate, the material being Cu or Ni, and
   at least one semiconductor circuit arrangement arranged on a first part of the contact region,
   wherein at least a second part of the contact region not covered by the semiconductor circuit arrangement is formed with a protection effective against oxidation, the second part of the contact region provided for at least one of a later external and an internal electrical contact-connection to a semiconductor substrate, the contact region provided with a surface directly on the top side of the ceramic carrier substrate; and
   wherein the protection is formed as at least one protection layer made of Ti, TiW, TiV, V, Cr, Pt, alloys thereof or oxides of Ti, TiW, TiV, V, Cr, Pt or organic materials.

2. The semiconductor module as claimed in claim 1, in which the protection is formed in multilayer fashion.

3. The semiconductor module as claimed in claim 1, in which the protection is formed with or from a conformal layer.

4. The semiconductor module as claimed in claim 1, in which the protection is formed with or from a monomolecular layer.

5. The semiconductor module as claimed in claim 1, wherein the protection is formed with or from benzimidazoles.

6. The semiconductor module as claimed in claim 1, in which the protection is provided as a chemically selective structure by at least one of the group consisting of a vapor deposition, sputtering, dip wetting, spraying and printing.

7. The semiconductor module as claimed in claim 1, comprising at least one of a Direct Copper Bonding (DCB) substrate, a Direct Aluminum Bonding (DAB) substrate and an Active Metal Brazing (AMB) substrate.

8. The semiconductor module as claimed in claim 1, wherein only the second part of the contact region that is not covered by the semiconductor circuit arrangement is formed with the protection.

9. A semiconductor module, comprising:
a ceramic carrier substrate with a contact region made of a contact material formed on top side of the ceramic carrier substrate, the contact material being Cu, or Ni, and
at least one semiconductor circuit arrangement arranged on a first part of the contact region,
wherein at least a second part of the contact region not covered by the semiconductor circuit arrangement is formed with a protection effective against oxidation, the second part of the contact region provided for at least one of a later external and an internal contact-connection to a semiconductor substrate, the contact material provided with a surface directly on the top side of the ceramic carrier substrate; and
wherein the protection comprises a monomolecular layer.

10. The semiconductor module as claimed in claim 9, in which the protection is formed as at least one of an admixture and a material constituent of the at least one contact region.

11. The semiconductor module as claimed in claim 1, in which the means for protection is formed with or from a conformal layer.

12. A semiconductor module, comprising:
a ceramic carrier substrate with a top side and with an underside;
at least one semiconductor circuit arrangement on at least one of the top side and the underside of the ceramic carrier substrate; and
at least one contact region for at least one of a later external and an internal electrical contact-connection of a semiconductor substrate made from or with a contact material with a surface on the at least one of the top side and the underside of the ceramic carrier substrate are formed, the contact material being Cu or Ni;
wherein the at least one semiconductor circuit arrangement is formed on a first part of the at least one contact region, and
wherein a second part of the at least one contact region is formed, at least partly, with a protection against oxidation, the second part not being covered by the semiconductor circuit arrangement and the protection being formed as at least one of an admixture and a material constituent of the at least one contact region.

13. The semiconductor module as claimed in claim 12, wherein a first part of the at least one contact region is covered by the at least one semiconductor circuit arrangement.

14. The semiconductor module as claimed in claim 12, further comprising a bonding wire wherein an end forms an electrical contact-connection with the protection.

15. The semiconductor module as claimed in claim 1, further comprising at least one contact region with a surface on the underside of the carrier substrate.

* * * * *